(12) United States Patent
Dzafic

(10) Patent No.: US 10,488,447 B2
(45) Date of Patent: Nov. 26, 2019

(54) METHOD FOR STATE ESTIMATION OF A DISTRIBUTION NETWORK BASED ON REAL TIME MEASUREMENT VALUES

(71) Applicant: SIEMENS AKTIENGESELLSCHAFT, Munich (DE)

(72) Inventor: Izudin Dzafic, Sarajevo (BA)

(73) Assignee: Siemens Aktiengesellschaft, Munich (DE)

( * ) Notice: Subject to any disclaimer, the term of this patent is extended or adjusted under 35 U.S.C. 154(b) by 355 days.

(21) Appl. No.: 15/523,462

(22) PCT Filed: Oct. 31, 2014

(86) PCT No.: PCT/EP2014/073461
§ 371 (c)(1),
(2) Date: May 1, 2017

(87) PCT Pub. No.: WO2016/066218
PCT Pub. Date: May 6, 2016

(65) Prior Publication Data
US 2017/0315164 A1 Nov. 2, 2017

(51) Int. Cl.
| | | |
|---|---|---|
| G06F 11/30 | (2006.01) | |
| G01R 22/06 | (2006.01) | |
| G05B 23/02 | (2006.01) | |
| H02J 13/00 | (2006.01) | |
| G06F 5/01 | (2006.01) | |
| G06F 17/16 | (2006.01) | |
| G06Q 50/28 | (2012.01) | |

(52) U.S. Cl.
CPC ....... *G01R 22/061* (2013.01); *G05B 23/0221* (2013.01); *G06F 5/01* (2013.01); *G06F 17/16* (2013.01); *H02J 13/0006* (2013.01); *G06Q 50/28* (2013.01); *Y02E 60/74* (2013.01); *Y04S 10/30* (2013.01); *Y04S 10/56* (2013.01)

(58) Field of Classification Search
CPC .................................................. G01R 22/061
See application file for complete search history.

(56) References Cited

U.S. PATENT DOCUMENTS

| | | | |
|---|---|---|---|
| 2002/0116079 A1 | 8/2002 | Kern et al. | |
| 2005/0065744 A1* | 3/2005 | Cataltepe | G05B 17/02 |
| | | | 702/104 |
| 2005/0090995 A1 | 4/2005 | Sonderegger | |
| 2009/0015403 A1 | 1/2009 | Kuris et al. | |
| 2013/0304266 A1* | 11/2013 | Giannakis | G01R 21/133 |
| | | | 700/286 |

\* cited by examiner

*Primary Examiner* — Phuong Huynh
(74) *Attorney, Agent, or Firm* — Laurence Greenberg; Werner Stemer; Ralph Locher

(57) ABSTRACT

A method performs state estimation of a distribution network based on real time measurement values. The method includes calculating load scaling factors at least for non-redundantly measurable parts of the distribution network, determining whether each of the load scaling factors related to a non-redundantly measurable part of the distribution network is within a given range (RLSF), and discarding the measurement values related to the corresponding scaling factor for all load scaling factors outside the given range (RLSF). The network state of the distribution network is then estimated based on the remaining measurement values.

11 Claims, 3 Drawing Sheets

METHOD FOR STATE ESTIMATION OF A DISTRIBUTION NETWORK BASED ON REAL TIME MEASUREMENT VALUES

The invention relates to a method of state estimation of a distribution network based on real time measurement values wherein erroneous measurement values are detected and eliminated.

BACKGROUND

One of the essential functions of a system state estimator is to detect measurement errors, and to identify and eliminate them if possible. Measurements may contain errors due to various reasons. Large measurement errors can also occur when the meters have biases, drifts or wrong connections. Distribution networks are not measured with redundant number of meters, and thus this problem is very complex.

In most cases bad data detection can be done in state estimation preparation phase or after area estimation. However in order to be sure that all measurements are really correct, additional steps have to be taken.

SUMMARY OF THE INVENTION

In view of the above, an objective of the present invention is to improve the identification and elimination of bad (erroneous) data with respect to methods for state estimation.

A further objective is to provide a substation capable of identifying and eliminating bad (erroneous) data during state estimation.

An embodiment of the present invention relates to a method for state estimation of a distribution network based on real time measurement values, the method comprising the steps of:
  calculating load scaling factors at least for non-redundantly measurable parts of the distribution network,
  determining whether each of the load scaling factors related to a non-redundantly measurable part of the distribution network is within a given range,
  discarding the measurement values related to the corresponding scaling factor for all load scaling factors outside the given range, and
  estimating the network state of the distribution network based on the remaining measurement values.

An advantage of this embodiment of the invention is that erroneous data can be reliably detected and eliminated even during real time operations.

The method preferably further comprises the steps of storing a plurality of given ranges for load scaling factors in a memory, the ranges being assigned to different times of the day, days of the week and/or days of the year. The corresponding range is preferably read from said memory depending on the actual time of the day, the actual day of the week and/or the actual day of the year. The step of determining whether each of the load scaling factors is within said given range, is preferably carried out based on the range that has been read-out.

Moreover the method may further comprise the steps of storing a plurality of given ranges for load scaling factors in a memory, the ranges being assigned to different environmental parameters and/or weather conditions. The corresponding range is preferably read from said memory depending on the actual environmental parameters and/or weather conditions. The step of determining whether each of the load scaling factors is within said given range, is preferably carried out based on the range that has been read-out.

Further, one can combine the "time-related" embodiment and the "weather/environment-related" embodiment as described above. For instance, the method may comprise the steps of:
  storing a plurality of given ranges for load scaling factors in a memory, the ranges being assigned to different times of the day, days of the week and/or days of the year, environmental parameters and weather conditions,
  reading the corresponding range from said memory depending on the actual time of the day, day of the week and/or day of the year, the environmental parameters and the weather conditions, and
  said step of determining whether each of the load scaling factors is within said given range, is carried out based on the range that has been read-out.

A further embodiment of the invention relates to the method wherein the distribution network is connected to a transformer injecting electrical energy into the distribution network, and wherein said given range is defined by zero as the lower limit and the short-time rating of the transformer as the upper limit.

Moreover the method may comprise the steps of estimating a true value with respect to redundant measurements values, calculating a normalized residual for each measurement value with respect to the corresponding true value, discarding the measurement value related to the corresponding normalized residual for all normalized residuals exceeding a given threshold, and estimating the network state of the distribution network based on the remaining measurement values after discarding the measurement values related to scaling factors outside their given range and after discarding the measurement values related to normalized residuals exceeding their given threshold.

Said step of discarding the measurement values is preferably carried out by:
  (a) computing the residuals for each measurement value according to $$r_i = z_i - h_i(x), i = 1, \ldots, m \quad (1)$$

wherein
  $r_i$ designates residuals for measurement value i,
  $h_i(x)$ designates a nonlinear function relating measurement i to the state vector x,
  $z_i$ designates measurement value i, and
  i designates the respective measurement value.
  (b) computing normalized residuals according to:

$$r_{i,N} = \frac{|r_i|}{\sqrt{\Omega_{ii}}}, i = 1, \ldots, m \quad (2)$$

wherein $\Omega_{ii}$ designates the i-th diagonal element of the residual covariance matrix.
  (c) finding the largest normalized residual among the normalized residuals; and
  (d) eliminating the largest normalized residual and going back to step (c) if the largest normalized residual exceeds or equals said given threshold, and continuing with the consecutive step of estimating the network state on the remaining measurement values if the largest normalized residual is below said given threshold.

The true values may be calculated based on a method of least squares with respect to the corresponding redundant measurements values.

A further embodiment of the invention relates to a substation comprising a calculating unit configured to carry out the steps of: calculating load scaling factors at least for non-redundantly measurable parts of the distribution network, determining whether each of the load scaling factors related to a non-redundantly measurable part of the distribution network is within a given range, discarding the measurement values related to the corresponding scaling factor for all load scaling factors outside the given range, and estimating the network state of the distribution network based on the remaining measurement values.

The substation may further comprise a memory storing a plurality of given ranges for load scaling factors, the ranges being assigned to different times of the day, days of the week and/or days of the year, environmental parameters and weather conditions, wherein the calculating unit is configured to read the corresponding range from said memory depending on the actual time of the day, day of the week and/or day of the year, the environmental parameters and the weather conditions, and to apply the range that has been read-out when said step of determining whether each of the load scaling factors is within said given range, is carried out.

Furthermore said substation's calculating unit may be configured to carry out the steps of estimating a true value with respect to redundant measurements values, calculating a normalized residual for each measurement value with respect to the corresponding true value, discarding the measurement value related to the corresponding normalized residual for all normalized residuals exceeding a given threshold, and estimating the network state of the distribution network based on the remaining measurement values after discarding the measurement values related to scaling factors outside their given range and after discarding the measurement values related to normalized residuals exceeding their given threshold.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended drawings. Understanding that these drawings depict only typical embodiments of the invention and are therefore not to be considered to be limiting of its scope, the invention will be described and explained with additional specificity and detail by the use of the accompanying drawings in which in an exemplary fashion

DETAILED DESCRIPTION OF THE PREFERRED EMBODIMENT

The preferred embodiment of the present invention will be best understood by reference to the drawings, wherein identical or comparable parts are designated by the same reference signs throughout.

It will be readily understood that the present invention, as generally described and illustrated in the figures herein, could vary in a wide range. Thus, the following more detailed description of the exemplary embodiments of the present invention, as represented in the figures, is not intended to limit the scope of the invention, as claimed, but is merely representative of presently preferred embodiments of the invention.

Step 1 Eliminating Obviously Wrong Measurements

Figure 1:
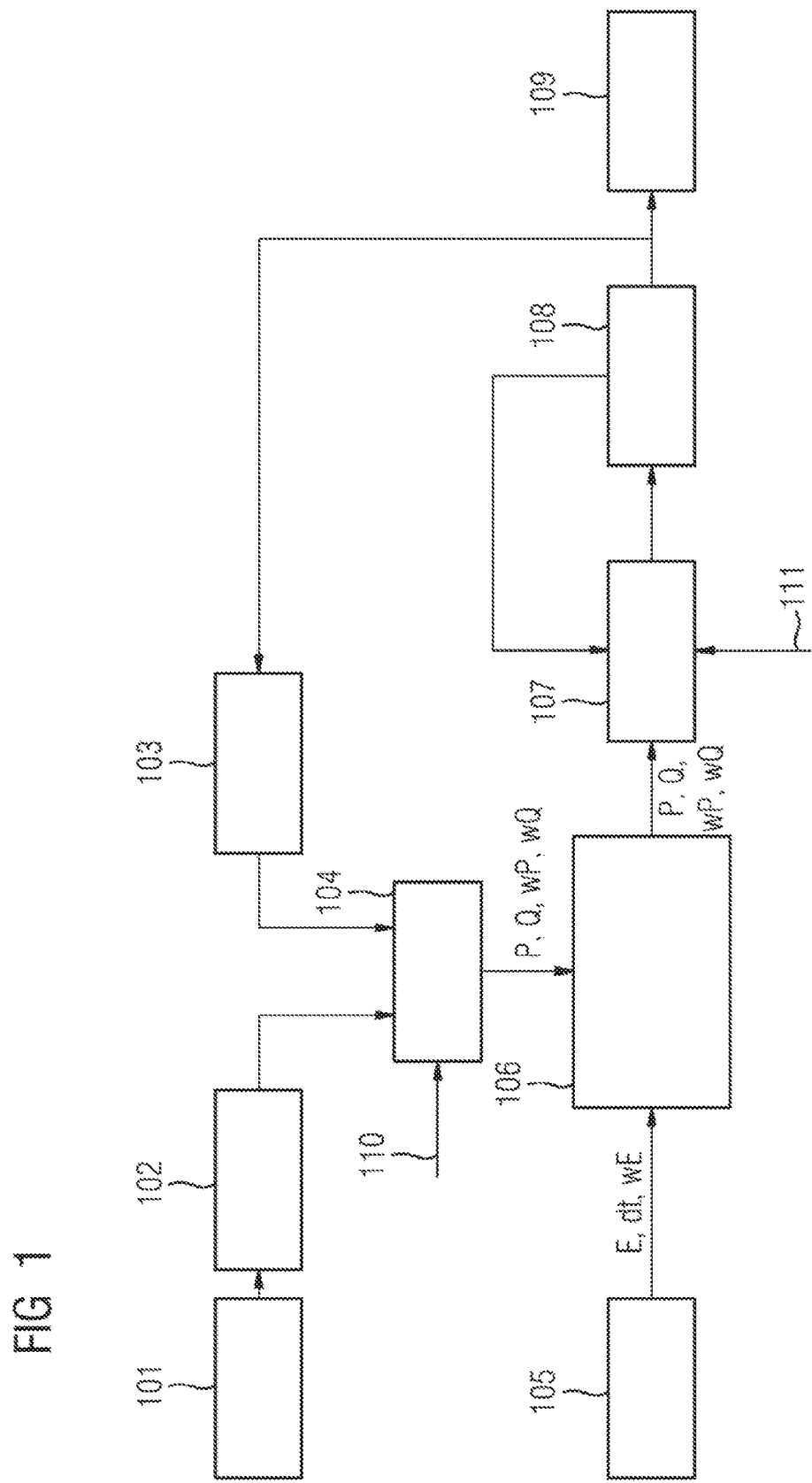
FIG. 1 shows an exemplary embodiment of a system capable of carrying out a method according to the present invention, said system comprising a bad data detection and elimination module.

FIG. 1 shows an embodiment of a system that is capable of identifying and eliminating bad data. The system comprises a bad data detection and elimination module which is located between a distribution system state estimation unit (DSSE) 107 and a supervisory control and data acquisition (SCADA) unit 109.

In FIG. 1, P designates the electrical power; Q designates the load; E designates the amplitude of the electrical field; I designates the current; V designates the voltage; dt designates small change in time; wE designates a weighting factor for energy measurement; wP designates a weighting factor for active power measurement; wQ designates a weighting factor for reactive power measurement; reference numeral 101 designates an operator; reference numeral 102 designates a "statistics" module; reference numeral 103 designates a "history of data" module; reference numeral 104 designates a "short term load forecasting (STLF)" unit; reference numeral 105 designates an "advanced metering infrastructure (AMI)" unit and/or an "automatic meter reading (AMR)" unit; reference numeral 106 designates a pre-processing unit for smoothing and discretization; reference numeral 107 designates the distribution system state estimation (DSSE) unit, reference numeral 108 designates an erroneous measurements detection unit; reference numeral 109 designates the supervisory control and data acquisition (SCADA) unit; reference numeral 110 designates the temperature, humidity and wind; reference numeral 111 designates real time measurements of the electrical power, load, current and voltage.

Erroneous data in WLS (weighted least squares)-based state estimation algorithms is commonly handled using normalized residuals. Whilst such an approach is applicable in this case, performance requirements for real time computations would be more easily met if the detection of obviously bad measurements is carried out separately. In DSSE, obviously bad measurements are defined as those which result in load group scaling factors that fall outside reasonable limits.

The load group scaling factor limits can be derived from the distribution transformer rating; in practice, the scaled load is nonnegative and should not exceed the short-term rating of the transformer.

Figure 2:
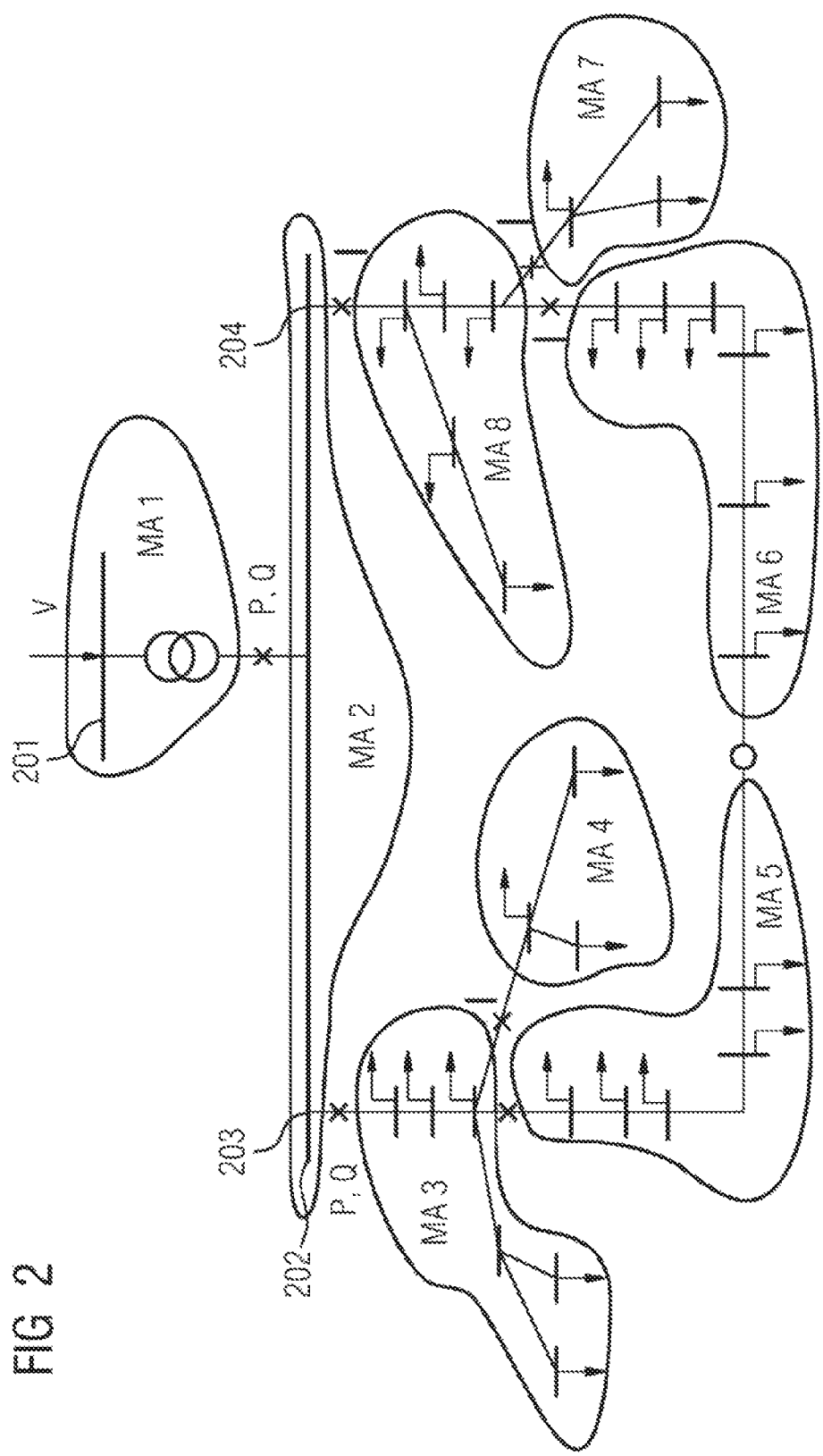
FIG. 2 shows an exemplary embodiment of a simple Distribution Management Systems (DMS) Network.

FIG. 2 shows an exemplary embodiment of a IEEE 13-node feeder with three MAs. In FIG. 2, small crosses designate realtime measurements; small flashes or arrows designate electrical loads defined by load curves; MA designate measurement areas; P designates the real load; Q designates the reactive load; reference numeral 201 designates an injection source busbar; reference numeral 202 designates a feeder head busbar; reference numeral 203 designates a first feeder; and reference numeral 204 designates a second feeder.

Consider for illustration the current magnitude measurement on the branch connecting MA 3 to MA 4 in FIG. 2. If this measured current magnitude is much larger than its true value, then the iterative solution of the WLS estimator with equality constraints will compute a negative load scaling factor for one of the MAs so that the corresponding load group behaves as a source supplying the large current magnitude. The negative scaling factor indicates that this current measurement should be automatically discarded. Similarly, a measured current magnitude which is much smaller than its true value will result in a scaling factor that is much less than a reasonable lower limit, again signalling that the measurement should be discarded.

The method for handling obviously erroneous data requires simply checking the values of load scaling factors that are significantly outside their limits for the specific time of day and weather conditions. Significant violations are used to disable the corresponding measurement, while small violations are enforced at their limits during the iterative solution of the WLS problem. Using this procedure it is possible to eliminate measurements measurement area MA3 and MA4, MA3 and MA5, MA8 and MA7, MA8 and MA6. Other bad measurements cannot be eliminated using this approach.

The identification of bad data is demonstrated in two tests on the IEEE 13-node feeder with three MAs.

The following Table 1 shows in an exemplary fashion erroneous data identification in a 13-node test system with 3 measurement areas (MA).

| | | Test 1 | | | Test 2 | | |
|---|---|---|---|---|---|---|---|
| Loc. | Ph. | KFROM | KTO | BDF | KFROM | KTO | BDF |
| TR$_1$ | A | 1.00 | 0.91 | 0.09 | 1.00 | 0.91 | 0.09 |
| TR$_1$ | B | 1.00 | 0.98 | 0.02 | 1.00 | 0.98 | 0.02 |
| TR$_1$ | C | 1.00 | 0.98 | 0.02 | 1.00 | 0.98 | 0.02 |
| L3 | A | 0.91 | 0.21 | 0.70 | 0.91 | 0.00 | 0.91 |
| L3 | B | 0.98 | 1.02 | 0.04 | 0.98 | 1.02 | 0.04 |
| L3 | C | 0.98 | 1.02 | 0.04 | 0.98 | 1.02 | 0.04 |
| L11 | A | 0.21 | 5.49 | 5.28 | 0.00 | 9.82 | 9.82 |
| L11 | C | 0.98 | 1.06 | 0.08 | 0.98 | 1.06 | 0.08 |

The following Table 2 shows the connection type and phases with load in the IEEE-13 test feeder:

| Node | Phase | Conn. | Node | Phase | Conn. |
|---|---|---|---|---|---|
| 632 | ABC | Y | 680 | ABC | Y |
| 634 | ABC | Y | 652 | A | Y |
| 645 | B | Y | 692 | CA | Δ |
| 646 | BC | Δ | 611 | C | Y |
| 671 | ABC | Δ | EN | ABC | Y |
| 675 | ABC | Y | | | |

The normal Bad Data Factor (BDF) value in this system is not expected to exceed 2; this corresponds to a minimum load scaling factor of 0 and a maximum of 2. In the first test, the current magnitude measurement in phase-A of line 11 was increased to 300 A; for comparison, the normal value quoted in 3 is 54.17 A.

The DSSE results in table 1 show that the worst scaling factor in MA 3 (lower left) for phase A is 5.49; in MA 2 (lower right) the worst scaling factor is 0.21 while in all other areas and phases the scaling is around 1. The BDF for L11-A is 5.28, which is larger than the maximum normal value, thus signalling that this measurement is bad.

In the second test, the measured current magnitude in phase-A of line 11 is now assumed to be 600 A. In this case, the worst scaling factor KFROM corresponding to L11-A is negative; it is clamped to zero in the DSSE results in table 1. The corresponding BDF value of 9.82 is much larger than the maximum normal value, again indicating the existence of bad data. This step can identify bad data if measurement is located between two areas and both contain loads. In case where all such measurements are ok, Step 2 has to be started in order to find bad data on areas without load (MA 2 on FIG. 2).

Step 2 Find and Eliminate Measurements Measurement on "More Redundant" DMS Network Parts Since Step 1 checks all measurements which are on radial nonredundant parts, this measurements can be ignored from the further analysis. This can be done by analyzing portion of networks on which normalized residuals are applied.

Step 2a) After solving WLS estimation for the whole network, and finishing step 1, detect all parts which couldn't be identified using the obvious bad measurement approach Step 2b) Compute the residuals for each detected area (from step 2a):

$$r_i = z_i - h_i(x), i=1, \ldots, m \quad (1)$$

Step 2c) Compute the normalized residuals:

$$r_{i,N} = \frac{|r_i|}{\sqrt{\Omega_{ii}}}, i = 1, \ldots, m \quad (2)$$

Step 2d) Find k such that $r_{k,N}$ is the largest among all $r_{i,N}$ for i=1, . . . , m Step 2e) If $r_{k,N} \geq$ ERR, then k-th measurement will be identified as bad measurement. Here, ERR is a chosen identification threshold, for instance 4.0.

Step 2f) Eliminate the k-th measurement from the measurement set and go to step 2d, using next sub-area.

The following Table 3 shows in an exemplary fashion SCADA measurements, estimated values, and error deviation using current balancing and a DSSE (13-node test feeder).

| | | | Measurements | | current balancing | | DSSE | |
|---|---|---|---|---|---|---|---|---|
| Loc. | Ph. | Unit. | SCADA | EST. | e [%] | | EST. | e [%] |
| TR$_1$ | ABC | MW | 3.66 | 3.65 | 0.27 | | 3.67 | 0.27 |
| TR$_1$ | ABC | MVAr | 2.31 | 2.28 | 1.30 | | 2.30 | 0.43 |
| L2 | A | A | 95.67 | 127.98 | 33.77 | | 98.23 | 2.68 |
| L2 | B | A | 66.44 | 66.10 | 0.51 | | 67.90 | 2.20 |
| L2 | C | A | 70.15 | 70.19 | 0.06 | | 70.91 | 1.08 |
| L3 | A | A | 576.37 | 533.47 | 7.44 | | 578.94 | 0.45 |
| L3 | B | A | 265.25 | 303.90 | 14.57 | | 263.55 | 0.64 |
| L3 | C | A | 547.64 | 552.44 | 0.88 | | 545.30 | 0.43 |
| L5 | B | A | 145.54 | 139.48 | 4.16 | | 144.09 | 1.00 |
| L5 | C | A | 58.94 | 11.35 | 80.74 | | 57.77 | 1.99 |
| L5 | B | kV | 4.15 | 4.10 | 1.20 | | 4.11 | 0.96 |
| L5 | C | kV | 4.15 | 4.08 | 1.69 | | 4.09 | 1.45 |
| L8 | A | A | 280.80 | 275.38 | 1.93 | | 286.75 | 2.12 |
| L8 | B | A | 69.73 | 69.76 | 0.04 | | 70.10 | 0.53 |
| L8 | C | A | 194.79 | 181.37 | 6.89 | | 189.89 | 2.52 |
| L10 | A | A | 25.20 | 25.36 | 0.63 | | 25.85 | 2.58 |
| L10 | B | A | 22.50 | 25.15 | 11.78 | | 23.56 | 4.71 |
| L10 | C | A | 24.87 | 25.66 | 3.18 | | 24.23 | 2.57 |
| L11 | A | A | 54.17 | 54.55 | 0.70 | | 53.52 | 1.20 |
| L11 | C | A | 70.99 | 71.65 | 0.93 | | 70.95 | 0.06 |

The following Table 4 shows in an exemplary fashion active and reactive power load scaling factors using DSSE (13-node test feeder):

|      | P-Scaling |      |      | Q-Scaling |      |      |
| Node | A    | B    | C    | A    | B    | C    |
| ---- | ---- | ---- | ---- | ---- | ---- | ---- |
| 632  | 1.00 | 1.00 | 1.00 | 1.00 | 1.00 | 1.00 |
| 634  | 1.21 | 1.09 | 1.02 | 0.98 | 0.99 | 0.99 |
| 645  | —    | 0.99 | —    | —    | 1.02 | —    |
| 646  | —    | 0.98 | —    | —    | 0.99 | —    |
| 671  | 1.01 | 1.01 | 1.01 | 0.99 | 0.99 | 0.99 |
| 675  | 1.03 | 1.09 | 0.97 | 1.00 | 1.07 | 1.02 |
| 680  | 1.09 | 1.12 | 0.96 | 0.97 | 1.07 | 1.00 |
| 652  | 1.00 | —    | —    | 0.96 | —    | —    |
| 692  | —    | —    | 0.99 | —    | —    | 0.98 |
| 611  | —    | —    | 1.00 | —    | —    | 1.10 |
| EN   | 1.11 | 0.97 | 1.11 | 0.97 | 0.92 | 1.02 |

Figure 3:
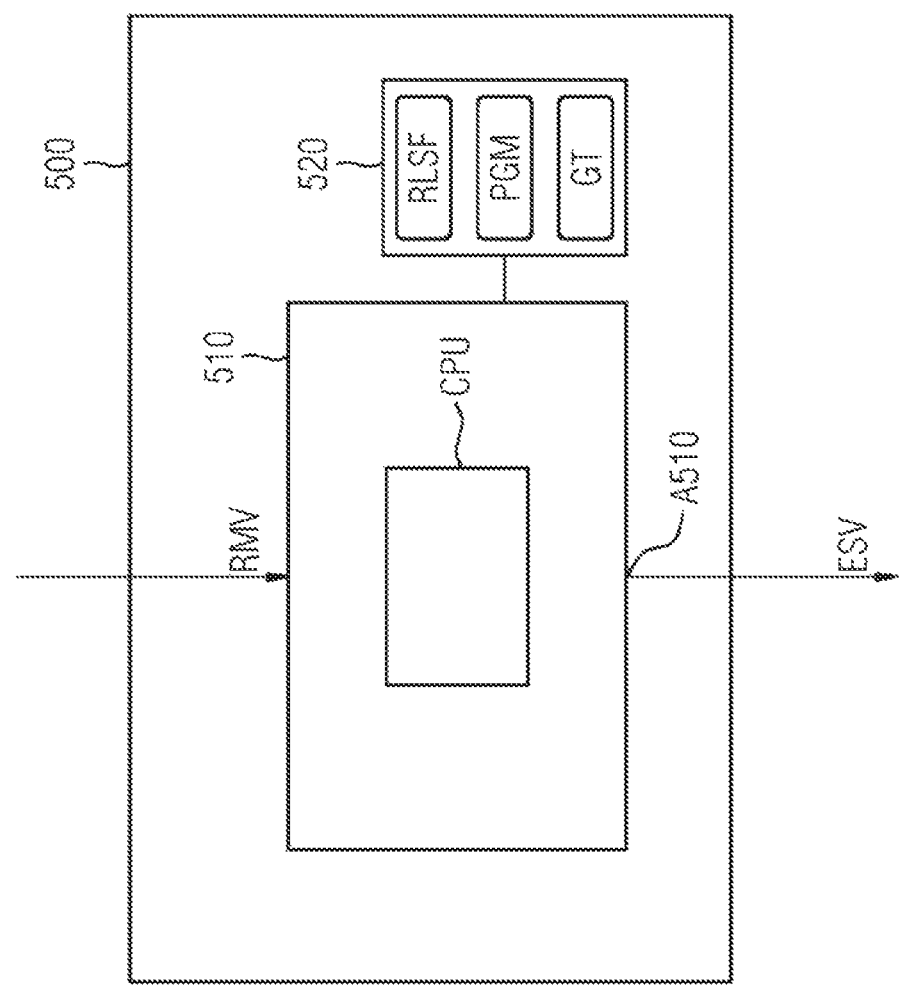
FIG. 3 shows an exemplary embodiment of a substation according to the present invention.

FIG. 3 shows an exemplary embodiment of a substation 500. The substation 500 comprises a calculating unit 510 and a memory 520 which stores a plurality of given ranges for load scaling factors RLSF, the ranges being assigned to different times of the day, days of the week and/or days of the year, environmental parameters and weather conditions.

The calculating unit 510 comprises a computing unit CPU which is programmed to carrying out the steps of calculating load scaling factors at least for non-redundantly measurable parts of the distribution network based on real time measurement values RMV, determining whether each of the load scaling factors related to a non-redundantly measurable part of the distribution network is within a given range RLSF, discarding the measurement values related to the corresponding scaling factor for all load scaling factors outside the given range RLSF, and estimating the network state of the distribution network based on the remaining measurement values. A corresponding network state value ESV may be outputted via port A510 of the calculating unit 510.

The computing unit CPU may be further programmed to estimate a true value with respect to redundant measurements values, calculate a normalized residual for each measurement value with respect to the corresponding true value, discard the measurement value related to the corresponding normalized residual for all normalized residuals exceeding a given threshold GT, and estimate the network state of the distribution network based on the remaining measurement values after discarding the measurement values related to scaling factors outside their given range and after discarding the measurement values related to normalized residuals exceeding their given threshold GT.

The program PGM that defines the processing of the computing unit CPU may be stored in the memory 520.

The invention claimed is:

1. A method for state estimation of a distribution network based on real time measurement values, the method comprises the steps of:
   calculating load scaling factors at least for non-redundantly measurable parts of the distribution network;
   determining whether each of the load scaling factors related to a non-redundantly measurable part of the distribution network is within a given range;
   discarding the real time measurement values related to a corresponding scaling factor for all the load scaling factors outside the given range; and
   estimating a network state of the distribution network based on remaining measurement values.

2. The method according to claim 1, which further comprises the steps of:
   storing a plurality of given ranges for the load scaling factors in a memory, the given ranges being assigned to different times of a day, days of a week and/or the days of a year;
   reading a corresponding given range from the memory depending on an actual time of the day, an actual day of the week and/or an actual day of the year; and
   carrying out the step of determining whether each of the load scaling factors is within the given range based on the given range that has been read-out.

3. The method according to claim 1, which further comprising the steps of:
   storing a plurality of given ranges for the load scaling factors in a memory, the given ranges being assigned to different environmental parameters and/or weather conditions;
   reading a corresponding given range from the memory depending on actual environmental parameters and/or actual weather conditions; and
   carrying out the step of determining whether each of the load scaling factors is within the given range based on the given range that has been read-out.

4. The method according to claim 1, further comprising the steps of:
   storing a plurality of given ranges for the load scaling factors in a memory, the given ranges being assigned to different times of a day, days of a week and/or the days of a year, environmental parameters and weather conditions;
   reading a corresponding given range from the memory depending on an actual time of the day, an actual day of the week and/or an actual day of the year, the environmental parameters and the weather conditions; and
   carrying out the step of determining whether each of the load scaling factors is within the given range out based on the given range that has been read-out.

5. The method according to claim 1, wherein:
   the distribution network is connected to a transformer injecting electrical energy into the distribution network; and
   the given range is defined by zero as a lower limit and a short-time rating of the transformer as an upper limit.

6. The method according to claim 1, which further comprises the steps of:
   estimating a true value with respect to redundant measurements values;
   calculating a normalized residual for each measurement value with respect to a corresponding true value;
   discarding the measurement values related to a corresponding normalized residual for all normalized residuals exceeding a given threshold; and
   estimating the network state of the distribution network based on the remaining measurement values after discarding the measurement values related to the load scaling factors outside their said given range and after discarding the measurement values related to the normalized residuals exceeding the given threshold.

7. The method according to claim 6, wherein the step of discarding the measurement values is carried out by the further steps of:
   a) computing the normalized residuals for each said measurement value according to $$r_i = z_i - h_i(x), \quad i=1,\ldots,m \qquad (1)$$

wherein:

$r_i$ designates the residuals for the measurement value i;

$h_i(x)$ designates a nonlinear function relating the measurement value i to a state vector x;

$z_i$ designates the measurement value i; and i designates the measurement value;

b) computing the normalized residuals according to:

$$r_{i,N} = \frac{|r_i|}{\sqrt{\Omega_{ii}}}, i = 1, \ldots, m \quad (2)$$

wherein $\Omega_{ii}$ designates an i-th diagonal element of a residual covariance matrix;

c) finding a largest normalized residual among the normalized residuals;

d) eliminating the largest normalized residual and going back to step (c) if the largest normalized residual exceeds or equals the given threshold, and continuing with a consecutive step of estimating the network state on the remaining measurement values if the largest normalized residual is below the given threshold.

8. The method according to claim 6, which further comprises basing the step of estimating the true value on a method of least squares with respect to the corresponding redundant measurements values.

9. A substation, comprising:
a calculating unit configured to carry out the steps of:
calculating load scaling factors at least for non-redundantly measurable parts of a distribution network;
determining whether each of the load scaling factors related to a non-redundantly measurable part of the distribution network is within a given range;
discarding measurement values related to corresponding load scaling factor for all the load scaling factors outside the given range; and
estimating a network state of the distribution network based on remaining measurement values.

10. The substation according to claim 9, further comprising:
a memory storing a plurality of given ranges for the load scaling factors, the given ranges being assigned to different times of a day, days of a week and/or days of a year, environmental parameters and weather conditions; and
said calculating unit is configured to read a corresponding given range from said memory depending on an actual time of the day, an actual day of the week and/or an actual day of the year, the environmental parameters and the weather conditions, and to apply the given range that has been read-out when the step of determining whether each of the load scaling factors is within the given range, is carried out.

11. The substation according to claim 9, wherein:
said calculating unit is configured to carry out the steps of:
estimating a true value with respect to redundant measurements values;
calculating a normalized residual for each of the measurement values with respect to a corresponding true value;
discarding a measurement value related to a corresponding normalized residual for all normalized residuals exceeding a given threshold; and
estimating the network state of the distribution network based on the remaining measurement values after discarding the measurement values related to the load scaling factors outside their said given range and after discarding the measurement values related to the normalized residuals exceeding their said given threshold.

* * * * *